United States Patent [19]

Nelson et al.

[11] Patent Number: 4,571,514

[45] Date of Patent: Feb. 18, 1986

[54] AMPLITUDE ADJUSTED PULSE WIDTH DISCRIMINATOR AND METHOD THEREFOR

[75] Inventors: Robert N. Nelson, Scottsdale; Keith A. Olds, Mesa; Scott C. White, Tempe, all of Ariz.

[73] Assignee: Motorola, Inc., Schaumburg, Ill.

[21] Appl. No.: 444,919

[22] Filed: Nov. 26, 1982

[51] Int. Cl.⁴ .......................... H03K 5/22; H03K 5/26
[52] U.S. Cl. .................................. 307/234; 307/265; 307/351; 307/352; 328/112; 329/106
[58] Field of Search ............... 307/350, 351, 352, 353, 307/356, 358, 265, 234, 266, 267; 328/111, 112; 329/106

[56] References Cited

U.S. PATENT DOCUMENTS

| | | | |
|---|---|---|---|
| 3,122,647 | 2/1964 | Huey | 307/88.5 |
| 3,226,570 | 12/1962 | Rosenbaum | 307/234 |
| 3,366,894 | 1/1968 | Newcomb, Jr. | 332/1 |
| 3,379,981 | 4/1968 | Humpherys | 328/112 |
| 3,387,221 | 6/1968 | Arberman et al. | 329/104 |
| 3,470,482 | 9/1969 | Kolnowski | 329/102 |
| 3,600,688 | 8/1971 | Booth | 328/111 |
| 3,611,157 | 10/1971 | Hughes | 328/112 |
| 3,624,529 | 11/1971 | Gebelein, Jr. | 329/104 |
| 3,737,779 | 6/1973 | Parker | 325/324 |
| 3,753,135 | 8/1973 | Kastner et al. | 329/106 |
| 3,790,881 | 2/1974 | Smith | 328/112 |
| 3,835,336 | 9/1974 | Block | 307/234 |
| 3,886,463 | 5/1975 | Caprio | 329/106 |
| 3,906,379 | 9/1975 | Tuhro | 328/112 |
| 3,909,730 | 9/1975 | Odom | 328/111 |
| 3,921,009 | 11/1975 | Comas et al. | 307/234 |
| 3,949,199 | 4/1976 | Odom | 377/55 |
| 3,958,133 | 5/1976 | Albano et al. | 307/234 |
| 3,961,271 | 6/1976 | Zlydak et al. | 328/111 |
| 3,997,798 | 12/1976 | Breimesser | 307/234 |
| 4,112,317 | 9/1978 | Everswick | 307/388 |
| 4,179,625 | 12/1979 | Carter | 307/324 |
| 4,216,388 | 8/1980 | Wilson | 307/234 |
| 4,223,270 | 9/1980 | Schmid et al. | 328/112 |
| 4,258,389 | 3/1981 | Sakamoto | 358/154 |

OTHER PUBLICATIONS

Design Focus, New Electronics, vol. 12, No. 20, 10-1-6-79, "Digital Control of a 555 Timer", by G. B. Clayton.

Design Focus, New Electronics, vol. 10, No. 20, 10-1-8-77, "Pulse Duration Event Timer", by Vernon Boyd.

*Primary Examiner*—Stanley D. Miller
*Assistant Examiner*—Richard Roseen
*Attorney, Agent, or Firm*—Raymond J. Warren

[57] ABSTRACT

An amplitude adjusted pulse width discriminator and method therefor wherein a received video pulse is sampled and held when it crosses a threshold. An indication of a valid pulse being present is given if the level of the signal at the input is within a preset range around the level of the held sample pulse at the end of a preset pulse width discrimination interval.

9 Claims, 8 Drawing Figures

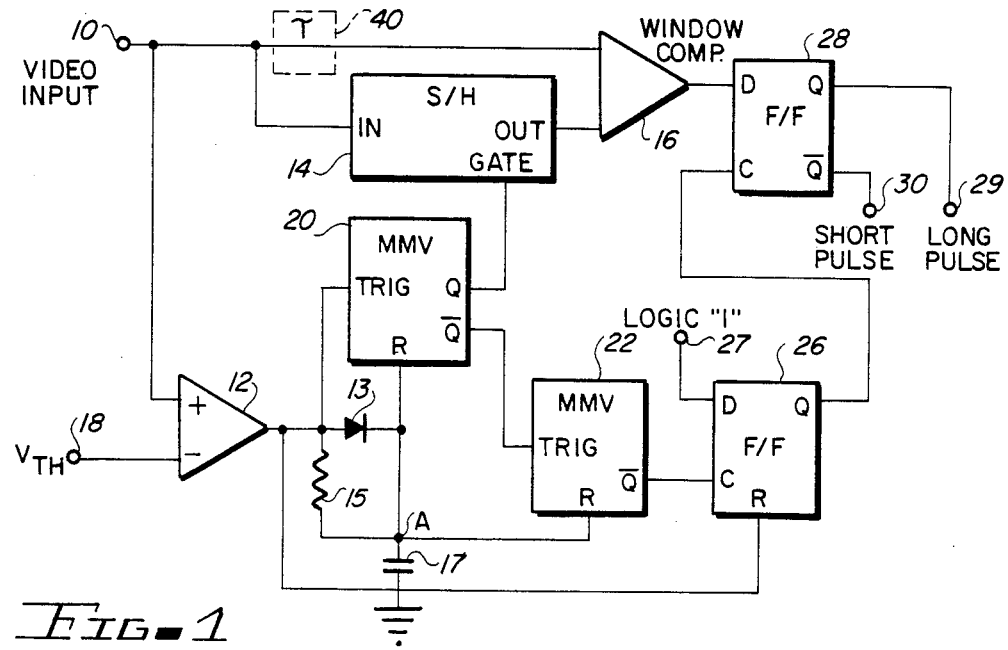
_FIG-1_
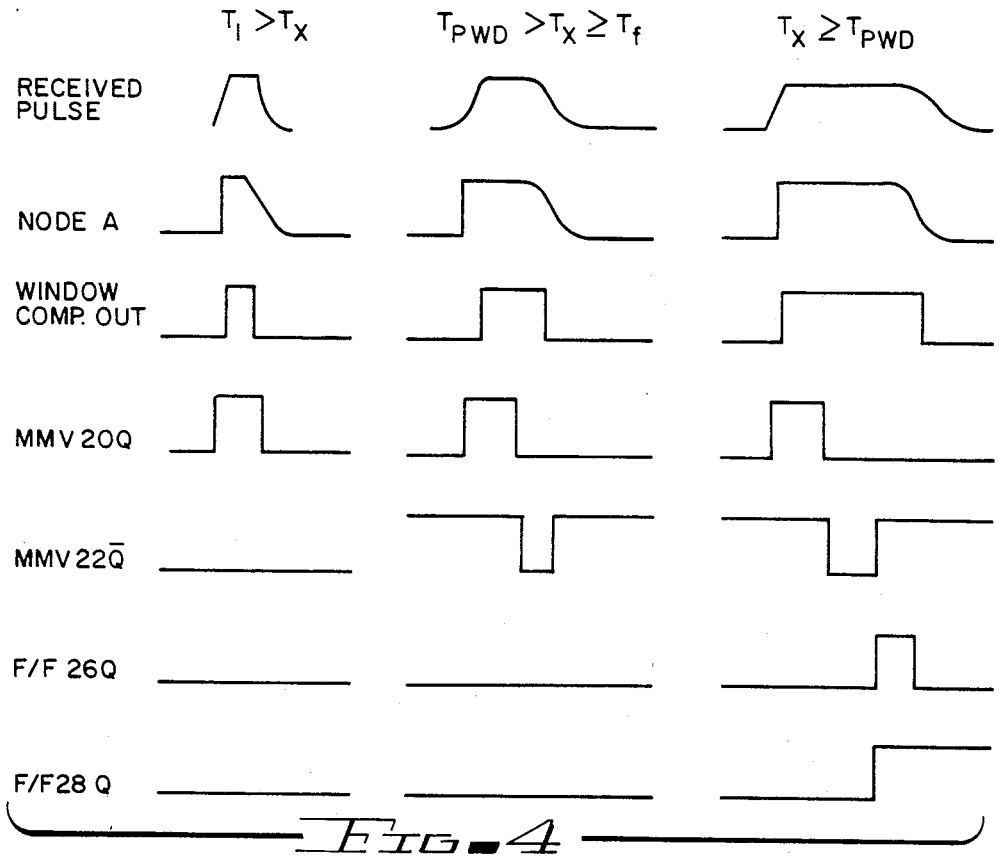
_FIG-4_

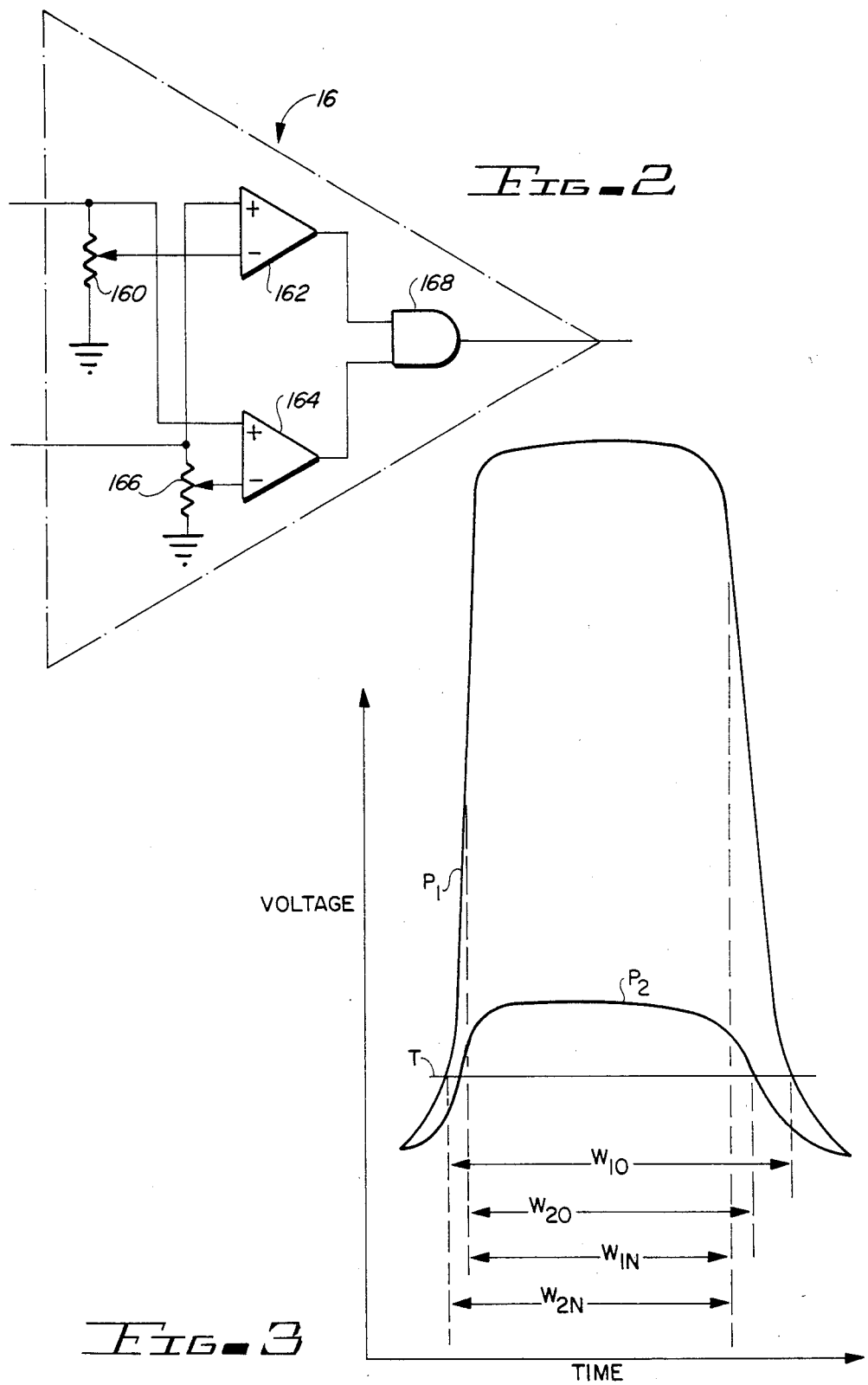

AMPLITUDE ADJUSTED PULSE WIDTH DISCRIMINATOR AND METHOD THEREFOR

BACKGROUND OF THE INVENTION

The present invention pertains to pulse width discriminators and methods therefore and in particular to amplitude adjusted pulse width discriminators and methods therefor.

There are many applications in which it is desirable to select a particular pulse sequence from among a mixture of pulse sequences, each of which has a characteristic pulse width. For example, it is desirable to construct radar beacons which can distinguish between trains of interrogation pulses having one width and other radio frequency pulse trains having the same frequency but having pulses with a different width.

A large number of approaches have been applied to the problem of discriminating among pulses having different widths. However, these approaches ordinarily assume that the pulses to be distinguished have a common, sharp rise time and a common, sharp fall time. In reality, even where received pulses have a sharp rise time, the fall time is often degraded. Furthermore, commonly available video amplifiers decrease the sharpness of the rising and falling edges of received pulses even further.

One approach to pulse width discrimination involves the use of a fixed threshold comparator which is triggered when the rising edge of the pulse exceeds a threshold and when the falling edge of the pulse falls below the threshold. However, due to a lack of sharpness, commonly called pulse stretching, pulses which have the same width but which differ in amplitude trigger a fixed threshold comparator at different points on the pulse, resulting in an inaccurate indication of pulse width. For the case of radar interrogation beacons in a signal-crowded environment where the pulses to be distinguished differ only slightly in pulse width but may differ in amplitude as well, the fixed threshold approach is inadequate for discriminating between desired and undesired pulses similar in width and having nearly or exactly the same frequency.

A second commonly used approach involves subtracting a pulse from a delayed version of the same pulse and applying the resulting waveform to a window comparator having a threshold set at some fixed voltage above and below zero volts. Due to the fixed threshold, this approach is also degraded by the finite rise and fall times of the pulse.

A further approach that avoids errors due to rise and fall times depends upon the use of a logarithmic amplifier and upon the special shape of a log pulse. However most useful systems, require the use of a linear range for weak signals in order to prevent log amplification of noise. The log pulse width discriminator degrades in this linear range. This degradation is particularly undesirable because many other system functions are also degraded at weak signal levels.

SUMMARY OF THE INVENTION

Accordingly, it is an object of the present invention to provide a new and improved amplitude adjusted pulse width discriminator.

It is a further object to provide a new and improved amplitude adjusted pulse width discriminator capable of distinguishing pulses that are close in width.

Yet a further object of the present invention is to provide a new and improved amplitude adjusted pulse width discriminator which provides accurate pulse width discrimination over a wide range of input pulse amplitudes and finite rise and fall times.

Another object of the present invention is to provide a new and improved amplitude adjusted method for discriminating among pulse widths.

Among the advantages of the present invention are its simplicity and low cost. Another advantage of the present invention is that very short video pulses can be rejected and the discriminator can be cleared without waiting for an entire decision interval to elapse.

These and other objects and advantages of the present invention will become apparent to those skilled in the art upon consideration of the accompanying specification, claims, and drawings.

In order to attain the above-mentioned and other objects and advantages, the apparatus of the present invention involves an amplitude adjusted pulse width discriminator for application to a received pulse having a leading edge. The pulse width discriminator comprises means, coupled to means for providing an input, for establishing a threshold signal indicating that the leading edge of the received pulse exceeds a selected threshold. Means for sampling and holding the received pulse to provide a held pulse sample is also coupled to the means for providing an input. Means for gating is coupled both to the means for establishing a threshold signal and to the means for sampling. Means for comparing the held pulse sample with the received pulse to provide a pulse amplitude window signal is coupled to the means for providing an input and to the means for sampling. In addition, means are coupled to the means for establishing a threshold signal for timing a desired pulse discrimination interval signal. Finally, means for providing an output signal indicative of a pulse width discrimination status is coupled to the means for comparing and to the means for timing and means for controlling the means for providing an output is coupled to the means for timing and the means for providing an output signal. The discriminator may further comprise a means for clearing coupled to the means for establishing a threshold signal, to the means for gating and to the means for timing.

The method according to the present invention involves an amplitude-adjusted method for discriminating among pulse widths for application to a received pulse having a leading edge in a device having an output circuit. The method according to the present invention comprises the steps of providing a threshold signal indicating that the leading edge of the received pulse exceeds a selected threshold and sampling of the received pulse to provide a pulse amplitude sample. The sampling step is gated and the pulse amplitude sample is held to provide a held pulse amplitude sample. The held amplitude pulse sample is compared with the received pulse to provide a pulse amplitude window signal. The method also comprises timing a desired pulse discrimination interval signal, triggering the gating step and the timing step by means of the threshold signal, enabling the output circuit with the pulse discrimination interval signal, using the pulse amplitude window signal to trigger the output circuit to provide a signal indicative of a pulse width discrimination status and controlling the output circuit to provide a signal indicative of pulse validity. The method according to the present invention may further comprise the steps of clearing the device when the width of the received pulse indicates that the pulse is invalid.

BRIEF DESCRIPTION OF THE DRAWINGS

FIG. 1 is a block diagram of a first embodiment of the present invention;

FIG. 2 is a block diagram of a window comparator for use in embodiments of the present invention;

FIG. 3 is a set of pulses depicting pulse widths as discriminated by the present invention;

FIG. 4 is a set of representative waveforms present at various points within the first embodiment as shown in FIG. 1;

DESCRIPTION OF THE PREFERRED EMBODIMENTS

Figure 5:
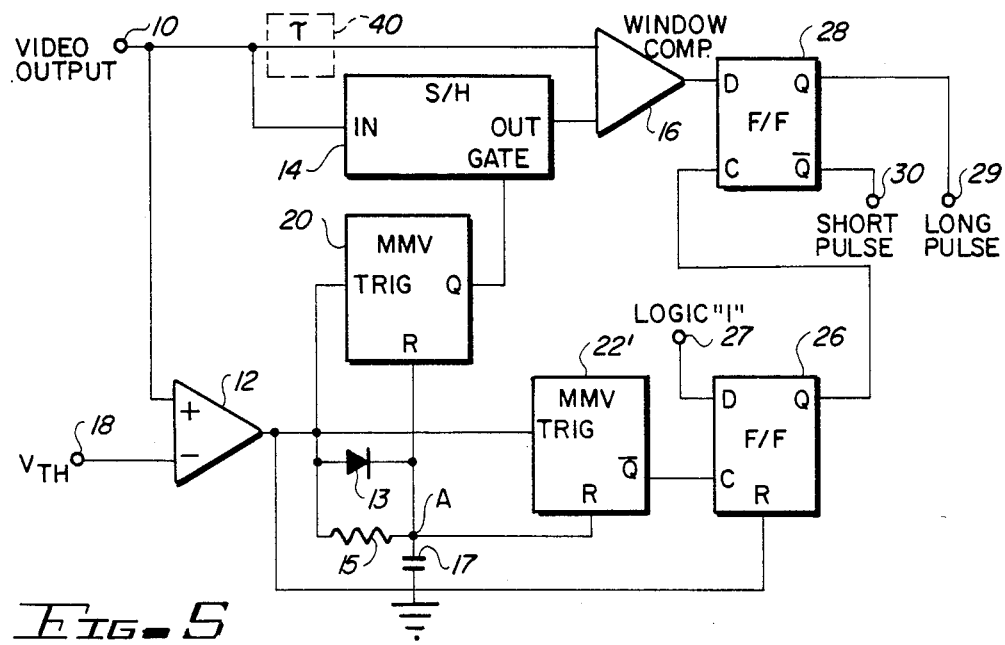
FIG. 5 is a second embodiment according to the present invention.

In a first embodiment of a pulse width discriminator according to the present invention, as illustrated in FIG. 1, a terminal suitable for application of a video input 10 is connected to a non-inverting input of a leading edge detector 12, to an analog signal input, IN, of a sample and hold circuit 14 and to a first input of a window comparator 16. An analog output, OUT, of circuit 14 is connected to a second input of comparator 16. An inverting input of leading edge detector 12 is connected to a terminal 18 suitable for application of a threshold potential, $V_{TH}$.

A trigger input, TRIG, of a first monostable multivibrator 20, an anode of a diode 13 and a first end of a resistor 15, are connected to the output of detector 12. A Q output of multivibrator 20 is connected to a gate input, GATE, of circuit 14. At a node A, a reset input, R, of first monostable 20 and a reset input, R, of a second monostable multivibrator 22 are connected to a cathode of diode 13, to a second end of resistor 15 and to a first end of a capacitor 17, a second end of which is connected to ground. A $\overline{Q}$ output of multivibrator 20 is connected to a trigger input, TRIG, of second monostable multivibrator 22. A $\overline{Q}$ output of multivibrator 22 is connected to a clock input, C, of a type D flip-flop 26, a reset input, R, of which is connected to the output of detector 12.

A D input of a flip-flop 28 is connected to an output of comparator 16 while a clock input, C, of flip-flop 28 is connected to a Q output of flip-flop 26. A D input of flip-flop 26 is connected to a terminal 27, suitable for application of a logic level "1" signal. A Q output of flip-flop 28 is connected to a terminal 29 suitable for transmitting a signal indicative of a long pulse and a $\overline{Q}$ output of flip-flop 28 is connected to a terminal 30 suitable for transmitting a signal indicative of a short pulse.

An optional delay 40 may be provided between input 10 and comparator 16. Delay 40 allows a threshold measurement to be taken of both ends of the pulse. Having the threshold measurement of both ends of the pulse allows the pulse width to be measured.

Window comparator 16 may comprise elements as shown in FIG. 2. The first input of comparator 16 is connected to a first terminal of a first variable resistance 160, while a second terminal of variable resistance 160 is connected to ground and a tap of variable resistance 160 is connected to an inverting input of a first comparator 162. The first input to window comparator 16 is also coupled to a non-inverting input of a second comparator 164, an inverting input of which is coupled to a wiper of a second variable resistance 166. A first terminal of variable resistance 166 is connected to the second input of window comparator 16 while a second terminal of variable resistance 166 is connected to ground. The second input of window comparator 16 is also connected to a non-inverting input of first comparator 162.

An output of first comparator 162 is connected to a first input of an AND gate 168. A second input of AND gate 168 is connected to an output of second comparator 164. The output of window comparator 16 is connected to an output of AND gate 168.

Leading edge detector 12 may comprise a comparator used as a threshold detector as is well understood in the art. Monostable multivibrators and other timing circuits, diodes, flip-flops and other bistable circuits, fixed and variable resistances, capacitors, comparators and AND gates are well known and readily available to those skilled in the art and will not be discussed further. A monostable multivibrator particularly suitable for use in the embodiments depicted in FIGS. 1 and 5 has a generic part number 74LS221, and is available, for example, from Texas Instruments, Inc., Dallas, Texas. Likewise, sample and hold circuits capable of sampling an analog input, holding the sample, and providing an analog output as controlled by a gating circuit such as a multivibrator, are well known to those skilled in the art and are readily available without the use of inventive skills.

FIG. 3 illustrates the advantage achieved by the present invention in determining pulse widths over that attained by prior art devices. A first exemplary pulse $P_1$ having a large amplitude and a second exemplary pulse $P_2$ having the same width but having a lesser amplitude are shown.

Existing discriminators detect a leading and a following edge of a pulse by establishing a fixed threshold, T, which triggers the discriminator. Accordingly, pulse $P_1$ triggers existing devices when a leading edge exceeds threshold T and again when a falling edge falls below threshold T, resulting in a determination of a pulse width $W_{10}$. Similarly, a pulse $P_2$, having a lesser amplitude, triggers existing discriminators on a rising edge and a falling edge to provide a pulse width $W_{20}$. However, because the trailing edges of lower amplitude pulses fall below threshold T sooner than do the trailing edges of higher amplitude pulses having the same width, the difference between detected pulse widths $W_{10}$ and $W_{20}$ creates a problem. In this sort of device it is unclear whether the difference in detected pulse widths should be interpreted as being indicative of two pulses having different widths or as being indicative of two pulses having the same width within a range of uncertainty. This problem becomes particularly acute in applications, such as radar beacons, where it is necessary to discriminate among a large number of types of pulses that differ only slightly in width but may vary in amplitude.

The present invention solves this problem by using a fixed threshold to detect the relatively sharp leading edge of the pulse but by determining the degraded falling edge of the pulse as the detected level of the pulse falls outside of a range about a sample taken of the pulse. By always triggering early on the leading edge and early on the falling edge, large variations due to finite rise and fall times are avoided.

In the operation of the embodiment of FIG. 1, a video input pulse is received through terminal 10 and applied to the non-inverting input of leading edge detector 12 so that if the received pulse exceeds the threshold voltage selected and applied to terminal 18, detector 12 provides a threshold output signal indicating that the leading edge of the received pulse exceeds the selected threshold.

Multivibrator 20 is triggered by the rising edge of the output signal from detector 12. Sample and hold circuit 14 is gated by the rising edge of the signal from the Q output of multivibrator 20 to sample the input pulse and by the falling edge of the signal from the Q output of multivibrator 20 to hold the level of the input pulse. Multivibrator 22 in turn is triggered by the rising edge of the $\overline{Q}$ output signal from multivibrator 20.

If the level of the input pulse falls within the range about the level of the output signal from the sample and hold circuit 14 as set in window comparator 16, a high level output signal from comparator 16 is applied to the D input of flip-flop 28 so that clocking of flip-flop 28 results in a high level signal indicative of a long and hence valid pulse having the desired width from the Q output of flip-flop 28 through terminal 29.

Diode 13 allows free application of the rising edge of an output pulse from comparator 12 to the reset input of monostable multivibrator 20 and 22 but forces the current associated with the falling edge to pass through the combination of resistor 15 and capacitor 17. Resistor 15 and capacitor 17 are chosen to slow the falling edge of the pulse applied to the reset inputs of monostables 20 and 22. A working model according to the embodiment of FIG. 1 may use a 74LS221 monostable for both multivibrators 20 and 22, a part having a generic number 1N5711 for diode 13, a resistor 15 having a resistance of 200Ω and a capacitor 17 having a capacitance of 1000 pF.

The duty cycle of multivibrator 20 is preset to be a sufficient percentage of the desired pulse width to provide a proper sample for comparison in window comparator 16. Such a preset value is readily obtained by one skilled in the art and requires no further elaboration. The duty cycle of multivibrator 22 is preset to provide a desired pulse width discrimination interval equal to the minimum desired pulse width.

In addition, by means well known to those skilled in the art, the taps of variable resistances 160 and 166 are set to provide a given range of input pulse amplitudes which, when compared to the amplitude of the sample and hold output signal, allow a high output from window comparator 16. For example, the tap of variable resistance 160 may be set to apply 85% of the voltage of the input pulse received at the first input to comparator 16 to the inverting input of comparator 162 and the tap of variable resistance 166 can be set to apply 85% of the voltage of the held signal transmitted on the second input to comparator 16 to the inverting input of comparator 164. Thus, if the voltage of the received pulse is greater than 85% of that of the held pulse amplitude sample from sample and hold circuit 14, the output of comparator 164 is high. Similarly, if 85% of the voltage of the received pulse is less than that of the held pulse amplitude sample, the output of comparator 162 is high. If and only if both the output of comparator 162 and the output of comparator 164 are high, the output of AND gate 168 is high indicating that the received pulse has an amplitude between 85 and 115% of that of the held pulse amplitude sample.

One advantage of the use of window comparator 16 is that it allows discrimination between overlapping pulses where a subsequently received pulse is more than 15% greater in amplitude or more than 15% less in amplitude than an overlapping and prior sampled pulse.

As illustrated in FIG. 4, the pulse width discrimination interval, $T_{PWD}$, according to the first embodiment of the present invention is determined by the period, $T_1$, of the output signal from multivibrator 20 plus the period of the output signal from multivibrator 22. Therefore, in the case depicted in the first column of FIG. 4 where the width of the received pulse, $T_X$, is less than $T_1$, flip-flop 28 is never clocked and the Q output of flip-flop 28 remains low because multivibrator 22 is reset by the falling edge of the signal at node A before it can clock flip-flop 26. If the period of the received pulse is greater than or equal to $T_1$ but less than $T_{PWD}$, as shown in the second column of FIG. 4, the rising edge of the output signal from multivibrator 22 clocks flip-flop 26, but because the level of the output signal from comparator 12 is falling, flip-flop 26 is held in a reset mode, and the Q output of flip-flop 28 is not clocked. Lastly, as illustrated in the third column of FIG. 4, if $T_X$ is greater than or equal to $T_{PWD}$, flip-flop 28 will be clocked by the rising edge of the output signal from flip-flop 26 while the level of the output signal from window comparator 16 is high so that a one level bit will appear at the Q output of flip-flop 28 indicating that a long enough pulse is present. If flip-flop 28 is clocked when the output signal from window comparator 16 is low, because the video input is not within the window established by sample and hold 14, the outputs of flip-flop 28 will not change state and no valid pulse indication will occur.

A second embodiment of the present invention is shown in FIG. 5 wherein the reference numerals of the structures of the first embodiment which are connected differently than they are in FIG. 1 are indicated by the addition of a prime. Specifically, both a trigger input, TRIG, of a multivibrator 20' and the trigger input, TRIG, of a multivibrator 22' are connected to the output of detector 12 while a Q output of multivibrator 20' is connected to the GATE input of circuit 14. A reset input, R, of multivibrator 22' and a reset input, R, of multivibrator 20' are connected to node A. A $\overline{Q}$ output of multivibrator 22' is connected to the C input of flip-flop 26.

Figure 6:
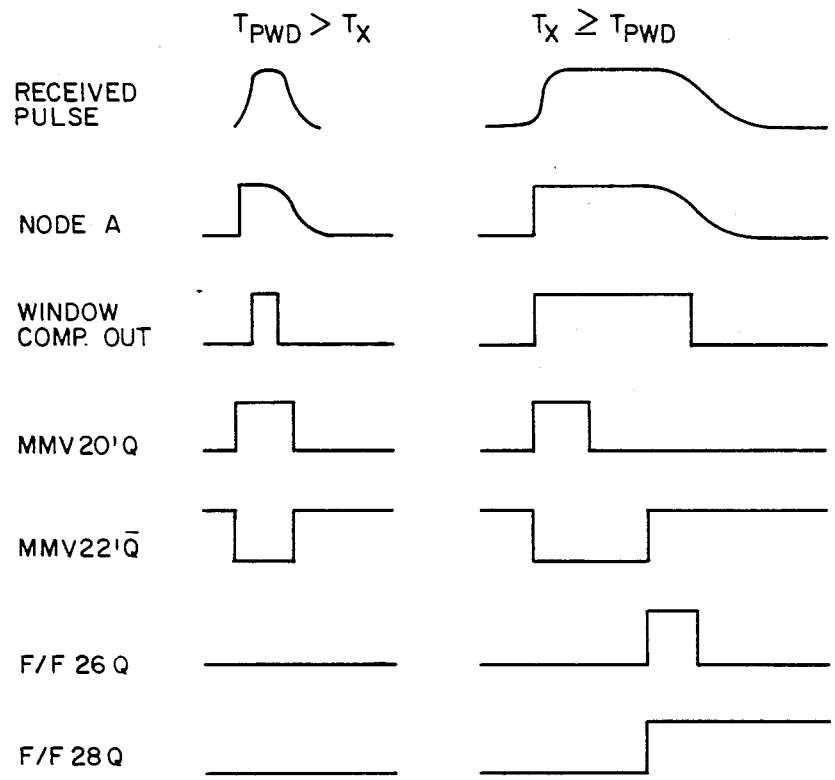
FIG. 6 is a set of representative waveforms present at various points within the embodiment of FIG. 5.

In the operation of the embodiment of FIG. 5 as illustrated in FIG. 6, where the width, $T_X$, of a received pulse is less than a pulse width discrimination interval, $T_{PWD}$, which is determined by the duty cycle of multivibrator 22', and which is set to be longer than the duty cycle of multivibrator 20', multivibrator 22' is reset before the end of its duty cycle. However, even though flip-flop 26 is clocked by the rising edge of the signal from the $\overline{Q}$ output of multivibrator 22', flip-flop 26 is held reset by the falling level of the output signal from detector 12 and thus flip-flop 28 is not clocked.

As also shown in FIG. 6, when the width of the received pulse $T_X$ is greater than or equal to the pulse width discrimination interval $T_{PWD}$, the level of the output signal from window comparator 16 is high when flip-flop 28 is clocked by the rising edge of the output signal from flip-flop 26 at the end of the pulse width discrimination interval. In this case a "1" level bit is clocked through flip-flop 28 and a high level signal appears at the Q output of flip-flop 28 indicating that a long enough pulse is present.

The present invention has been tested by varying an input voltage magnitude and by observing the input pulse width at which the Q output of flip-flop 28 changed state. For a device constructed according to the embodiment of FIG. 5, where $V_{TH}$ equaled 35 millivolts, where variable resistance 160 was set to apply 85% of the voltage of a received pulse to the inverting input of comparator 162, where variable resistance 166 was set to apply 85% of the voltage of a held pulse sample to the inverting input of comparator 164, where monostable multivibrator 22' was set to have a period of 2.10 microseconds and where an input pulse having a rise time and a fall time each (10%–90%) of 300 nanoseconds was applied, results for various pulse amplitudes are shown in Table I.

TABLE I

| INPUT PULSE AMPLITUDE (mV) | DISCRIMINATED PULSE WIDTH (μs) |
|---|---|
| 80 | 2.22 |
| 100 | 2.21 |
| 150 | 2.15 |
| 200 | 2.08 |
| 600 | 2.05 |
| 1000 | 2.05 |
| 2000 | 2.05 |
| 3000 | 2.05 |
| 4000 | 2.05 |

Over the input range of 80 millivolts to 4 volts, the output pulse width detection variation was 170 nanoseconds, which was well within the acceptable 200 nanoseconds pulse width detection variation allowable in an illustrative radar interrogation beacon.

Figure 7:
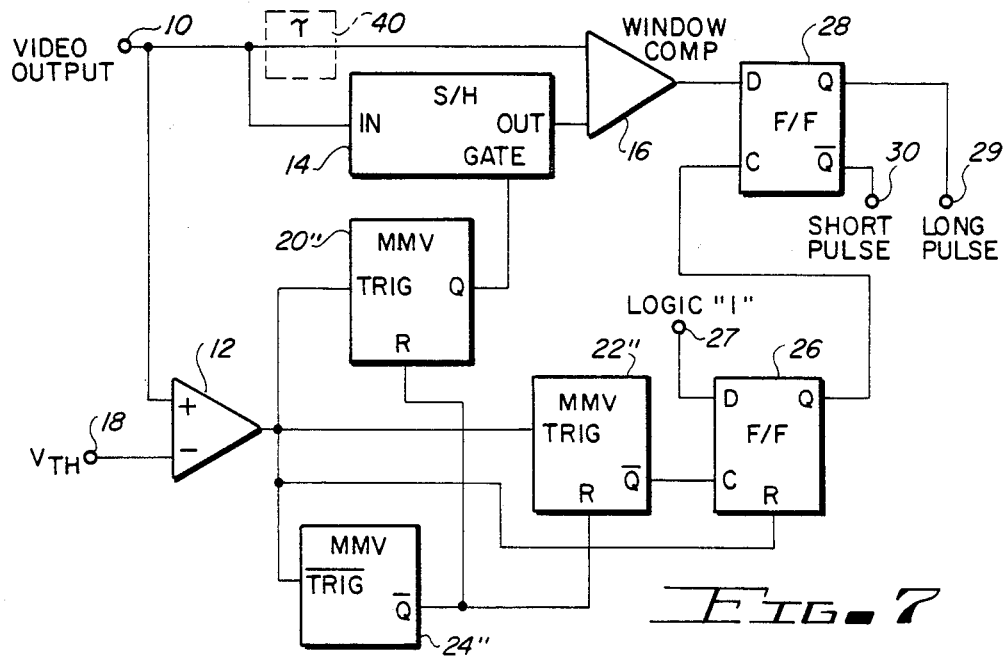
FIG. 7 is a block diagram of a third embodiment of the present invention.

A third embodiment according to the present invention is illustrated in FIG. 7 wherein devices which also appear in the embodiment of FIG. 1 but which are connected differently in the embodiment of FIG. 7 than in the embodiments of FIGS. 1 and 5, and a device which first appears in FIG. 7 are indicated by the presence of a double prime next to their reference numeral. Specifically, an output of leading edge detector 12 is connected to a trigger input, TRIG, of monostable multivibrator 20'', to a trigger input, TRIG, of a monostable multivibrator 22'' and to an inverted trigger input, $\overline{TRIG}$, of a monostable multivibrator 24''.

A Q output of multivibrator 24'' is connected to a reset input of multivibrator 20'' and to a reset input of multivibrator 22''. A Q output of multivibrator 20'' is connected to a gate input, GATE, of sample and hold 14. A $\overline{Q}$ output of multivibrator 22'' is connected to clock input, C, of flip-flop 26.

In the operation of the embodiment of FIG. 7, the rising edge of the output signal from detector 12 triggers both multivibrator 20'' and multivibrator 22''. The rising edge of the signal from the $\overline{Q}$ output of multivibrator 22'' clocks flip-flop 26. Because the D input of flip-flop 26 is tied to terminal 27 to which a logic level "1" signal is applied, when flip-flop 26 is clocked by multivibrator 22'' a logic level "1" signal is supplied from the Q output of flip-flop 26''. The rising edge of the signal from the Q output of flip-flop 26 clocks flip-flop 28.

For incoming pulses which fall below the threshold of detector 12 before the rising edge of the $\overline{Q}$ output of multivibrator 22'' clocks flip-flop 26, the falling edge of the output from detector 12 holds flip-flop 26 in a reset position and triggers the $\overline{TRIG}$ input of multivibrator 24'' so that the falling edge of the resulting signal from the $\overline{Q}$ output of multivibrator 24'' resets multivibrators 20'' and 22''. In this way multivibrator 24'' clears the pulse width discriminator when a very short video pulse is present without waiting for the entire pulse width decision interval timed by multivibrator 22'' to elapse.

Figure 8:
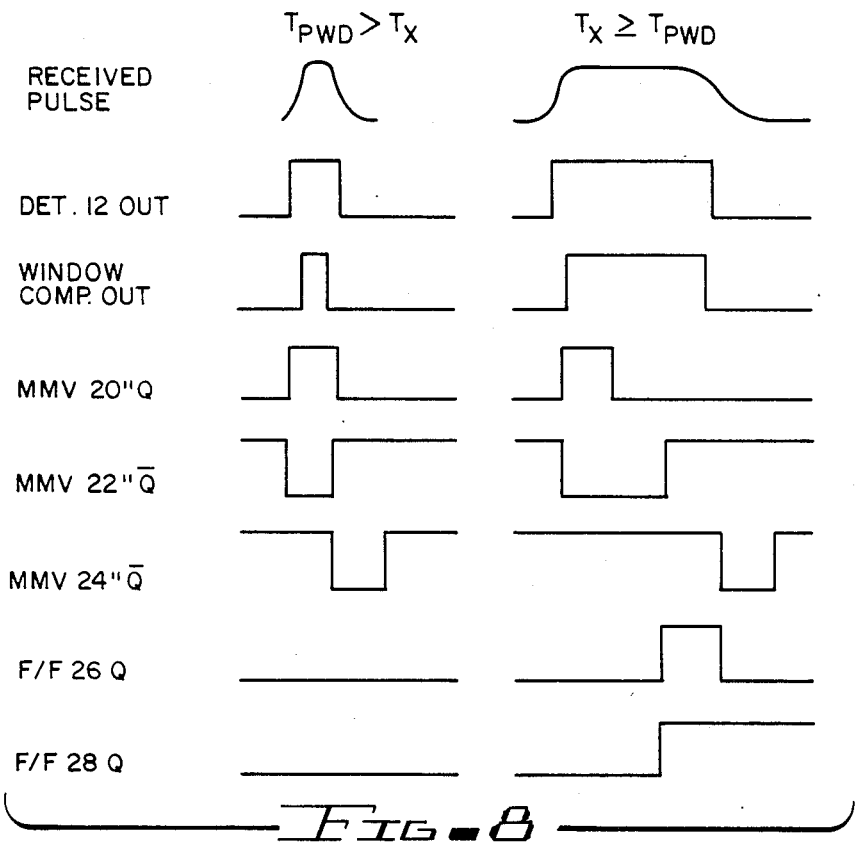
FIG. 8 is a set of representative waveforms present at various points within the embodiment of FIG. 7.

As shown in the first column of FIG. 8 for the case where the width, $T_X$, of the received pulse is less than the pulse width decision interval, $T_{PWD}$, as timed by multivibrator 22'', flip-flop 26 is held reset by detector 12 at the time when flip-flop 26 is clocked. On the other hand, as shown in the second column of FIG. 8, where $T_X$ is greater than or equal to $T_{PWD}$, the full pulse width discrimination interval PWD, is timed out and flip-flop 26 is clocked before multivibrator 24'' is triggered and before flip-flop 26 is reset by the falling edge of the output of detector 12. As a consequence, flip-flop 28 is clocked during the application of a high output from window comparator 16 so that a "1" level output signal indicating that a long enough pulse is present is applied to terminal 29.

While the present invention has been described in terms of a preferred embodiment, further modifications and improvements will occur to those skilled in the art. For example, although the embodiment of FIG. 7 provides a good compromise between log region performance and linear region performance useful in most applications, it is sometimes desirable to cover only a linear region. If only a linear region is to be covered by a system, it is particularly desirable to insert a delay line between video input 10 and the first input of window comparator 16 in any of the embodiments of FIGS. 1, 5 or 7. Based upon considerations well known to those skilled in the art, such a delay line is selected so that it delays the application of the input pulse to the first input of window comparator 16 for the length of the delay due to the combined actions of comparator 12 and monostable 20 (or 20', or 20'', according to the specific embodiment). In this way, sample and hold 14 completes its cycle before the first and second inputs of device 16 are compared. In this situation, theoretically perfect accuracy is obtained because the pulse width discriminator is triggered at a fixed percentage of the peak pulse amplitude.

Furthermore, although the present invention has been presented above in terms of its ability to select a long enough pulse as a valid signal at output 29, by choosing a high level signal from output 30 to be valid, pulse widths shorter than the pulse width discrimination interval of the embodiment may be selected as a valid pulse width discrimination status.

We desire it to be understood, therefore, that this invention is not limited to the particular forms shown and that we intend in the appended claims to cover all such equivalent variations which come within the scope of the invention as described.

What is claimed is:

1. An amplitude adjusted pulse width discriminator, for application of a received pulse having a leading edge, comprising:
   means for providing an input;
   means, coupled to said means for providing an input, for establishing a threshold signal indicating that the leading edge of a pulse received at said means for providing an input exceeds a selected threshold;

means, coupled to said means for providing an input, for sampling and holding the pulse received at said means for providing an input to provide a held pulse sample;

gating means for gating said means for sampling and holding, said gating means having an input, a reset, a first output and a second output, said input of said gating means being coupled to an output of said means for establishing a threshold signal and said first output of said gating means being coupled to a gate of said means for sampling and holding;

comparing means for comparing said held pulse sample with said pulse received at said means for providing an input to provide a pulse amplitude window signal, said comparing means having a first input, a second input and an output, said first input of said comparing means being coupled to said means for providing an input and said second input of said comparing means being coupled to an output of said means for sampling and holding;

timing means for timing a desired pulse discrimation interval signal, said timing means having a triggering input, a reset and an output, said triggering input of said timing means being coupled to said second output of said gating means and said reset of said timing means being coupled to said output of said means for establishing a threshold signal;

controlling means for controlling an output of said amplitude adjusted pulse width discriminator, said controlling means having a clock input, a reset and an output, said clock input of said controlling means being coupled to said output of said timing means and said reset of said controlling means being coupled to said output of said means for establishing a threshold signal;

means for providing an output signal indicative of a pulse width discrimination status, said means for providing an output signal having an input, a clock input and an output, said input of said means for providing an output signal being coupled to said output of said comparing means, said clock input of said means for providing an output signal being coupled to said output of said controlling means and said output of said means for providing an output signal being coupled to an output of said amplitude adjusted pulse width discriminator; and means for clearing said gating means and said timing means, said means for clearing being coupled to said reset of said gating means and to said reset of said timing means.

2. The amplitude adjusted pulse width discriminator of claim 1 wherein said comparing means comprises a window comparator.

3. The amplitude adjusted pulse width discriminator of claim 1 wherein said timing means is triggered by said gating means.

4. The amplitude adjusted pulse width discriminator of claim 1 further comprising means for delaying a signal, said means for delaying a signal being coupled between said means for providing an input and said first input of said comparing means.

5. An amplitude adjusted pulse width discriminator having an input suitable for application of a pulse and comprising:

a first edge detector coupled to the input;

a first timing circuit having a trigger coupled to an output of said first edge detector;

a second timing circuit having a trigger coupled to said output of said first edge detector;

a sample and hold circuit having a gate, an input and an output, said input of said sample and hold circuit being coupled to said input of said amplitude adjusted pulse width discriminator and said gate of said sample and hold circuit being coupled to an output of said first timing circuit;

a second edge detector having a first input, a second input and an output, said first input of said second edge detector being coupled to said input of said amplitude adjusted pulse width discriminator and said second input of said second edge detector being coupled to said output of said sample and hold circuit;

a first bistable circuit having an input coupled to said output of said second edge detector, said first bistable circuit providing an output of said amplitude adjusted pulse width discriminator; and a second bistable circuit having an input, a reset and an output, said reset of said second bistable circuit being coupled to said output of said first edge detector, said input of said second bistable circuit being coupled to an output of said second timing circuit and said output of said second bistable circuit being coupled to a clock of said first bistable circuit.

6. The amplitude adjusted pulse width discriminator of claim 5 further comprising a third timing circuit having an input and an output, said input of said third timing circuit being coupled to said output of said first edge detector and said output of said third timing circuit being coupled to a reset of said first timing circuit and to a reset of said second timing circuit.

7. The amplitude adjusted pulse width discriminator of claim 5 further comprising means for delaying a signal coupled between said input of said amplitude adjusted pulse width discriminator and said first input of said second edge detector.

8. The amplitude adjusted pulse width discriminator of claim 6 further comprising means for delaying a signal coupled between said input of said amplitude adjusted pulse width discriminator and said first input of said second edge detector.

9. An amplitude adjusted method for discriminating among pulse widths, for application of a received pulse having a leading edge in a device having an output circuit, comprising the steps of:

providing a threshold signal indicating that the leading edge of a pulse received by an amplitude adjusted pulse width discriminator exceeds a selected threshold;

sampling, with a sample and hold circuit, the pulse received by said amplitude adjusted pulse width discriminator to provide a pulse amplitude sample;

gating said sample and hold circuit with a gating signal from a gating circuit;

holding said pulse amplitude sample to provide a held pulse amplitude sample;

comparing said held pulse amplitude sample with said pulse received by said amplitude pulse width discriminator to provide a pulse amplitude window signal;

timing a desired pulse discrimination interval signal with a timing circuit;

triggering said gating circuit and said timing circuit by means of said threshold signal;

enabling a control circuit with said pulse discrimination interval signal;

controlling an output circuit with said control circuit by clocking said output circuit to provide a signal indicative of a pulse width discrimination status;

clearing the amplitude adjusted pulse width discriminator when the width of the pulse received by said amplitude adjusted pulse width discriminator indicates that said pulse received by said amplitude adjusted pulse width discriminator is invalid.

* * * * *